United States Patent [19]

Aldinger et al.

[11] Patent Number: 4,627,815

[45] Date of Patent: Dec. 9, 1986

[54] CERAMIC TEMPERATURE STABILIZATION BODY, AND METHOD OF MAKING SAME

[75] Inventors: Fritz Aldinger, Rodenbach; Waltraud Werdecker, Hanau, both of Fed. Rep. of Germany

[73] Assignee: W.C. Heraeus GmbH, Hanau, Fed. Rep. of Germany

[21] Appl. No.: 660,499

[22] Filed: Oct. 12, 1984

[30] Foreign Application Priority Data

Oct. 15, 1983 [DE] Fed. Rep. of Germany ....... 3337630

[51] Int. Cl.$^4$ ............................................... F27D 7/00
[52] U.S. Cl. ......................................... 432/24; 501/96; 501/98; 75/244
[58] Field of Search ....................... 501/96, 98; 75/244; 432/24

[56] References Cited

U.S. PATENT DOCUMENTS

| | | | |
|---|---|---|---|
| 3,108,887 | 10/1963 | Lenie et al. | 501/96 |
| 3,473,894 | 10/1969 | Babl et al. | 501/96 |
| 3,718,490 | 2/1973 | Morgan et al. | 501/96 |
| 3,930,875 | 1/1976 | Ochiai et al. | 501/98 |
| 4,097,293 | 6/1978 | Komeya | 264/60 |
| 4,188,194 | 2/1980 | Corrigan | 51/307 |
| 4,203,733 | 5/1980 | Tanaka et al. | 51/295 |
| 4,256,792 | 3/1981 | Koepke | 428/119 |
| 4,289,503 | 9/1981 | Corrigan | 51/307 |
| 4,299,873 | 11/1981 | Ogihara | 428/137 |
| 4,435,513 | 3/1984 | Komeya | 501/96 |
| 4,519,966 | 5/1985 | Aldinger et al. | 501/98 |

FOREIGN PATENT DOCUMENTS

| | | | |
|---|---|---|---|
| 1906522 | 6/1970 | Fed. Rep. of Germany | 75/244 |
| 808800 | 1/1975 | Japan . | |
| 58-32072 | 2/1983 | Japan . | |
| 58-32073 | 2/1983 | Japan . | |
| 1230823 | 5/1971 | United Kingdom | 75/244 |

OTHER PUBLICATIONS

Ullmanns Encyclopedia der technischen Chemie 17, 1979, p. 519, Ullmanns..., p. 523.

*Primary Examiner*—William R. Dixon, Jr.
*Assistant Examiner*—Steven Capella
*Attorney, Agent, or Firm*—Frishauf, Holtz, Goodman & Woodward

[57] ABSTRACT

The temperature stabilization body is made of pulverized aluminum nitride with a first additive of pulverized aluminum present between 0.05% to 2%, and a grain size of under 1 micrometer, and a second additive of from 0.1% to 10% of an oxide, preferably yttrium oxide, present at about 1%—all precentages by weight, in which the mixture is ground in a ceramic ball mill to a grain size of not over 0.1 mm, subjected to cold isostatic pressure in the order of 2500 bar to form a green, pressed body, and then sintered at a sintering temperature of between 1750° C. to 2000° C. The heat conductivity of the densely sintered aluminum nitride body will then be at least 140 W/m °K., and a heat conductivity of twice as much can be obtained, the body being non-toxic and not subject to creep under temperatures up to at least 1700° C.

14 Claims, No Drawings

CERAMIC TEMPERATURE STABILIZATION BODY, AND METHOD OF MAKING SAME

Reference to related publication:
European Patent Application No. 75 857, to which U.S. Pat. No. 4,435,513, Komeya et al, corresponds

CROSS-REFERENCE

U.S. application Ser. No. 563,026, filed Dec. 19, 1983, incorporated herein by reference, in its entirety.

REFERENCE TO RELATED PUBLICATIONS

1. Ullmanns Encyklopädie der technischen Chemie 17, 1979, Page 519
2. Ullmanns Encyklopädie der technischen Chemie 17, 1979, Page 523

The present invention relates to a temperature stabilization body made of ceramic material; as a temperature stabilization body, one usually understands an element, for example in brick or plate form, which can be introduced into a furnace to render uniform the temperature within the furnace, even though the heat source for the furnace may be localized.

BACKGROUND

Temperature stabilization bodies are primarily used to provide a temperature which is as constant and uniform as possible within a predetermined space, so that, on a surface or zone in the space, the temperature transfer to elements located within that space will be constant and uniform. Temperature stabilization bodies are used usually in those installations where temperature gradients should be as small as possible. Temperature stabilization bodies, for example, are utilized in carefully temperature controlled processes, such as processes involving melting and pulling of single crystals, for example for semiconductor use, highest quality and purity glasses and the like, quartz crystals, and for similar applications. The temperature stabilization bodies may be, for example, in form of a tube, an external boat or mortar, or a jacket applied over or around all or at least on a portion of a pulling boat or mortar. Temperature stabilization bodies also find use in thermal analysis apparatus, in form of furnace liners or blocks, for heat treatment during sintering and/or high temperature and pressure treatment; they may be constructed in form of a lining for furnaces, or furnace inserts.

When used in low-temperature ranges—considering the application for which temperature stabilization bodies are usually used, that is temperature ranges of less than 1000° C.; it is customary to utilize temperature stabilization bodies made of metal, which have good heat transfer charcteristics, such as copper, silver, or aluminum. Such temperature stabilization bodies, in which heat is conducted readily throughout the body so that the overall temperature of the body shows but little change between respective zones thereof, have the disadvantage that they have a low melting temperature and low recrystallization temperature, already at low temperatures—wherein "low" is intended to mean temperatures of less than 1000° C. Such metallic temperature stabilization bodies, usually in the form of essentially solid sheets, tubes or blocks, have an additional disadvantage: They tend to creep, that is, they tend to deform due to their inherent weight. Metal temperature stabilization bodies cannot be used for higher temperatures, in which "higher" is intended to convey a temperature range in excess of 1000° C., and, typically, substantially in excess thereof.

It has been proposed to use temperature stabilization bodies made of beryllium oxide. In actual practice, beryllium oxide cannot be used since beryllium oxide is highly toxic and, thus, handling of beryllium oxide causes difficulty and preferably should be avoided. Additionally, beryllium oxide, although having excellent heat conductivity at low temperatures, loses this excellent heat conductivity as the temperatures increase and rise into the high-temperature levels, which is frequently required.

It has already been proposed to obtain bodies of any desired shape made by sintering of powder mixture containing aluminum nitride, at least one of the oxides of calcium, barium and strontium and carbon—see U.S. Pat. No. 4,435,513 Komeya et al. Bodies of comparatively high density and good heat conductivity up to about 71 W/m°K. could be obtained thereby. To facilitate sintering of aluminum nitride, it has been proposed to add oxides of the rare-earth metals, for example yttrium oxide or lanthanum oxide, calcium oxide, barium oxide and strontium oxide.

THE INVENTION

It is an object to provide a temperature stabilization body made of ceramic material which can be used under high temperature conditions to receive, conduct, transfer and reradiate heat, without deterioration, which is non-toxic, and effective.

Briefly, the heat stabilization comprises densely sintered aluminum nitride having a heat conductivity of at least 140 W/m°K.

It has been found that when using aluminum nitride which is densely sintered, temperature stabilization bodies can be made which can be used up to about 1700° C., which have high strength, excellent acceptance of temperature changes, and which can be readily handled and shaped, while being entirely non-toxic. Bodies made of densely sintered aluminum nitride have excellent resistance with respect to hot gases.

DETAILED DESCRIPTION

The starting material for the temperature stabilization body is, preferably, a powdered mixture of aluminum nitride which, with respect to the aluminum nitride, has 0.05% to 2% aluminum powder (by weight) added thereto. The aluminum powder preferably has a grain size below one micrometer. 0.1% to 10% (by weight of the aluminum nitride) of an oxide is further added.

The mixture is cold-pressed or cold-formed by, preferably isostatic, pressure at high compression forces to green bodies of suitable shape, which, then, are densely sintered in an inert atmosphere, preferably nitrogen.

The bodies, in accordance with the invention, will have a heat conductivity of at least 140 W/m°K. although, by control of the type and quantity of the addition of the metal oxide, the thermal coefficient of expansion and the heat conductivity can be controlled, and a substantially higher heat conductivity up to about 200 W/m°K. can be obtained.

The oxide additives are oxides of the earth-alkali metals, rare-earth metals, such as scandium, yttrium, lanthanum to lutetium, transition elements of the IVth, Vth, and VIth groups of the periodic system of elements, aluminum oxide and silicon dioxide. These additives may be used singly, or in combination, and are added in quantities of from 0.01% to 10% of the weight of the aluminum nitride.

Yttrium oxide is particularly suitable, preferably in a quantity of from 0.5% to 4% (by weight of the aluminum nitride).

The temperature stabilization body can be used as a brick or block in furnaces, for example for thermal analysis, for high-temperature analysis up to about 1700° C., as a temperature equalization and stabilization body to render homogeneous the temperature within single-crystal pulling furnaces and the like; and in tubular form.

Example of process of manufacture 5 kg of a mixture of 99% of aluminum nitride, having 1% of aluminum powder of a grain size below 1 micrometer contained therein, and 1% of powdered yttrium oxide are ground in ball mill with ceramic milling balls under a protective atmosphere of argon for 40 hours, and then screened on a screen having a mesh width of 0.1 micrometer. All percentages in this example, and hereafter, are by weight.

The powder obtained by screening, and thus having a grain size of less than 0.1 micrometer is then subjected to isostatic cold compression under a pressure of about 2500 bar, to form the compressed green bodies of the shapes which are desired, and which are then placed in an electrically heated sintering furnace. The sintering furnace is evacuated to $10^{-5}$ mbar and heated to about 500° C. This temperature is maintained for an hour. Nitrogen is then introduced into the sintering furnace until the pressure is about 5 mbar. This pressure is maintained in the furnace, which then has its temperature increased until, within about 3 hours, the temperature has reached 1200° C. The pressure of nitrogen is then increased to about 140 mbar, and the temperature increased within an hour to about 1850° C. At that time, the nitrogen pressure will be 180 mbar.

This temperature and pressure are retained for about 2 hours, and then the furnace is permitted to cool. The density sintered bodies are removed from the sintering furnace after venting.

The temperature stabilization body thus made has a thermal coefficient of expansion of $3.6.10^{-6}/°K.$; a heat conductivity of 200 W/m°K.; a bending resistance of 320 N/mm$^2$, and a density of 3.27 g/cm$^3$ (=theoretical density).

"Densely" sintered means having a density of at least 98% of the theoretical density of the composition of the material, e.g. 98% of 3.27 g/cm$^3$ for the material of the example on page 6 above, W/m°K. means Watts per meter-degree Kelvin..

We claim:

1. Method of equalizing temperature within a confined area,
    where the temperature is above 1000° C., comprising the step of
    surrounding at least a portion of the confined area with a ceramic stabilization body,
    said temperature stabilization body comprising a densely sintered mixture of
        (a) powdered aluminum nitride;
        (b) a first additive of from 0.05% to 2% of aluminum powder, having a grain size under 1 micrometer, and
        (c) a second additive of from 0.1% to 10%, comprising at least one of the materials of the group consisting of: an oxide of an alkaline earth; an oxide of a rare earth metal; an oxide of a transition metal of the IVth, Vth, and VI groups of the periodic system; and silicon dioxide,
    said second additive being present in powder form,
    said body having been first cold-pressed and then densely sintered at a temperature of between 1700° C. to 2000° C.,
    all percentages being by weight and with reference to the aluminum nitride.

2. Method according to claim 1, wherein the body has been cold-pressed by isostatic pressure in a protective atmosphere at a pressure of about 2500 bar.

3. Method according to claim 1, wherein the mixture of aluminum nitride powder and said first and second additives has a grain size of below 0.1 micrometer.

4. Method according to claim 2, wherein the protective atmosphere comprises nitrogen.

5. Method according to claim 1, wherein the body has been cold-pressed by isostatic pressure in a protective atmosphere.

6. Method according to claim 5, wherein the protective atmosphere comprises nitrogen.

7. Method according to claim 3, wherein the body has been cold-pressed by isostatic pressure in a protective atmosphere.

8. Method according to claim 7, wherein the protective atmosphere comprises nitrogen.

9. Method of making a temperature stabilization body comprising
    cold-pressing a mixture of pulverized aluminum nitride
        and from 0.05% to 2% of aluminum powder having a grain size of less than 1 micrometer, and an oxide additive, to obtain a desired shape of the body;
    and then sintering said compressed mixture forming said body at a temperature of between about 1750° C. to 2000° C. in a protective atmosphere.

10. Method according to claim 9, wherein the protective atmosphere comprises nitrogen.

11. Method according to claim 9, wherein the oxide additive comprises at least one of the materials of the group consisting of: an oxide of an alkaline earth metal; an oxide of a rare-earth metal; an oxide of a transition metal of the IVth, Vth, and VIth groups of the periodic system; aluminum oxide; and silicon dioxide; said oxide being present in a concentration of from between 0.1%–10% by weight with reference to the aluminum nitride.

12. Method according to claim 9, wherein the oxide additive comprises yttrium oxide present in about 0.5%–4%, by weight, of the aluminum nitride.

13. Method according to claim 11, wherein the protective atmosphere comprises nitrogen.

14. Method according to claim 12, wherein the protective atmosphere comprises nitrogen.

* * * * *